United States Patent
Matsukura et al.

(10) Patent No.: US 11,476,391 B2
(45) Date of Patent: Oct. 18, 2022

(54) NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 99 days.

(21) Appl. No.: 16/894,015

(22) Filed: Jun. 5, 2020

(65) Prior Publication Data
US 2020/0388725 A1   Dec. 10, 2020

(30) Foreign Application Priority Data

Jun. 6, 2019   (JP) ............... JP2019-106276

(51) Int. Cl.
| | |
|---|---|
| H01L 33/32 | (2010.01) |
| H01L 33/06 | (2010.01) |
| H01L 33/14 | (2010.01) |
| H01L 33/12 | (2010.01) |
| H01L 33/00 | (2010.01) |

(52) U.S. Cl.
CPC .......... *H01L 33/325* (2013.01); *H01L 33/007* (2013.01); *H01L 33/0025* (2013.01); *H01L 33/06* (2013.01); *H01L 33/145* (2013.01); *H01L 33/12* (2013.01)

(58) Field of Classification Search
CPC .... H01L 33/325; H01L 33/0025; H01L 33/06
See application file for complete search history.

(56) References Cited

U.S. PATENT DOCUMENTS

| | | | |
|---|---|---|---|
| 6,630,692 B2 | 10/2003 | Goetz et al. | |
| 6,657,234 B1 | 12/2003 | Tanizawa | |
| 7,312,468 B2 | 12/2007 | Watanabe et al. | |
| 8,039,830 B2 | 10/2011 | Kaneko et al. | |
| 8,324,611 B2 | 12/2012 | Kaneko et al. | |
| 8,357,924 B2 * | 1/2013 | Kim ............ | H01L 33/32 257/13 |
| 8,536,615 B1 | 9/2013 | Driscoll et al. | |
| 8,604,461 B2 | 12/2013 | Driscoll et al. | |
| 8,692,228 B2 | 4/2014 | Kaneko et al. | |
| 8,823,047 B2 | 9/2014 | Han | |

(Continued)

FOREIGN PATENT DOCUMENTS

| | | |
|---|---|---|
| CN | 103337573 A | 10/2013 |
| JP | 2000-277868 A | 10/2000 |

(Continued)

OTHER PUBLICATIONS

Official Action dated Jul. 22, 2021 from related Taiwanese Application 109117309 together with English language translation.

(Continued)

*Primary Examiner* — Mark W Tornow
(74) *Attorney, Agent, or Firm* — Scully, Scott, Murphy & Presser, PC

(57) ABSTRACT

A nitride semiconductor light-emitting element includes an n-type cladding layer including n-type AlGaN, and an active layer that includes AlGaN and is located on the n-type cladding layer. Si concentration distribution in a direction of stacking the n-type cladding layer and the active layer has a local peak in the active layer.

11 Claims, 10 Drawing Sheets

(56) References Cited

U.S. PATENT DOCUMENTS

| | | | |
|---|---|---|---|
| 9,012,888 | B2 | 4/2015 | Kushibe et al. |
| 9,112,115 | B2 | 8/2015 | Inazu et al. |
| 10,020,421 | B2 | 7/2018 | Eichler et al. |
| 10,193,016 | B2 | 1/2019 | Fujita et al. |
| 2002/0190259 | A1 | 12/2002 | Goetz et al. |
| 2006/0027814 | A1 | 2/2006 | Watanabe et al. |
| 2007/0278474 | A1 | 12/2007 | Tsutsumi et al. |
| 2009/0179221 | A1 | 7/2009 | Han |
| 2010/0059734 | A1 | 3/2010 | Kaneko et al. |
| 2011/0140083 | A1 | 6/2011 | Driscoll et al. |
| 2013/0112988 | A1 | 5/2013 | Kaneko et al. |
| 2014/0021442 | A1 | 1/2014 | Inazu et al. |
| 2015/0349197 | A1* | 12/2015 | Watanabe ............... H01L 33/06 257/13 |
| 2017/0373220 | A1 | 12/2017 | Eichler et al. |
| 2018/0019375 | A1 | 1/2018 | Fujita et al. |
| 2018/0190863 | A1 | 7/2018 | Choi et al. |
| 2019/0355872 | A1* | 11/2019 | Matsukura ............ H01L 33/325 |
| 2020/0279973 | A1 | 9/2020 | Furusawa et al. |

FOREIGN PATENT DOCUMENTS

| | | |
|---|---|---|
| JP | 2000-332364 A | 11/2000 |
| JP | 2001-102629 A | 4/2001 |
| JP | 2003-037289 A | 2/2003 |
| JP | 2005-109425 A | 4/2005 |
| JP | 2007-299848 A | 11/2007 |
| JP | 2010-067709 A | 3/2010 |
| JP | 2011-054717 A | 3/2011 |
| JP | 2011-198859 A | 10/2011 |
| JP | 2013-065630 A | 4/2013 |
| JP | 2013-222746 A | 10/2013 |
| JP | 5641173 B2 | 12/2014 |
| JP | 2016-149544 A | 8/2016 |
| JP | 2018-500762 A | 1/2018 |
| JP | 2018-125428 A | 8/2018 |
| JP | 2019-50336 A | 3/2019 |
| JP | 2019-083221 A | 5/2019 |
| KR | 10-2009-0054813 A | 6/2009 |
| KR | 10-2014-0099646 A | 8/2014 |
| TW | 201135967 A1 | 10/2011 |
| WO | 00/76004 A1 | 12/2000 |
| WO | 2004/047245 A1 | 6/2004 |
| WO | 2012/144046 A1 | 10/2012 |
| WO | 2013/132812 A | 9/2013 |

OTHER PUBLICATIONS

Japanese Office Action dated Sep. 1, 2020 from JP 2019-106276 together with English language translation.

English Abstract of JP 2010-205767, dated Sep. 16, 2010.

Final Notification of Reasons for Refusal from related JP 2019-106276 together with English language translation.

Office Action dated Apr. 19, 2022 from related Japanese Patent Application JP 2020-182684 together with English language translation.

* cited by examiner

|  | Si(atoms/cm$^3$) | Power(a.u.@20mA) |
|---|---|---|
| COMPARATIVE EXAMPLE | $1.0 \times 10^{18}$ | 0.51 |
| EXAMPLE 1 | $2.0 \times 10^{19}$ | 0.63 |
| EXAMPLE 2 | $4.0 \times 10^{19}$ | 0.82 |
| EXAMPLE 3 | $4.1 \times 10^{19}$ | 0.85 |
| EXAMPLE 4 | $6.2 \times 10^{19}$ | 0.72 |
| EXAMPLE 5 | $8.2 \times 10^{19}$ | 0.70 |
| EXAMPLE 6 | $1.1 \times 10^{20}$ | 0.39 |
| EXAMPLE 7 | $1.3 \times 10^{20}$ | 0.07 |

NITRIDE SEMICONDUCTOR LIGHT-EMITTING ELEMENT

The present application is based on Japanese Patent Application No. 2019-106276 filed on Jun. 6, 2019, the entire contents of which are incorporated herein by reference.

BACKGROUND OF THE INVENTION

1. Field of the Invention

The invention relates to a nitride semiconductor light-emitting element.

2. Related Art

In recent years, nitride semiconductor light-emitting elements such as light-emitting diodes or laser diodes which emit blue light have been put into practical use and various approaches have been attempted to improve light output (see, e.g., Japanese Patent No. 5641173).

The light-emitting element described in Japanese Patent No. 5641173 is a light-emitting element with an emission wavelength of not more than 300 nm to be formed on an AlN-based group III nitride single crystal, and has a high-concentration n-type group III nitride layer, a multiple quantum well structure composed of n-type or i-type group III nitride barrier layers and n-type or i-type group III nitride well layers, an i-type group III nitride final barrier layer, a p-type group III nitride layer, and an electron blocking layer formed of a p-type or i-type AlN layer which is provided between the i-type group III nitride final barrier layer and the p-type group III nitride layer and acts as an electron energy barrier for the i-type group III nitride final barrier layer, wherein the i-type group III nitride final barrier layers have a thickness of 2 nm to 10 nm and the n-type or i-type group III nitride well layers have a thickness of not more than 2 nm.

In the method described in Japanese Patent No. 5641173, luminous efficacy is improved by adjusting the film thicknesses of the i-type group III nitride well layers and the i-type group III nitride final barrier layer. However, even when such a measure is taken, there is still room for improvement to obtain sufficient light output when using group III nitride semiconductors. Based on such a background, the present inventors intensively studied how to improve light output when using group III nitride semiconductors and completed the invention.

THE SUMMARY OF THE INVENTION

Therefore, it is an object of the invention to provide a nitride semiconductor light-emitting element with improved light output.

According to a feature of the invention, a semiconductor light-emitting device, comprises:

A nitride semiconductor light-emitting element, comprising:
   an n-type cladding layer comprising n-type AlGaN; and
   an active layer that comprises AlGaN and is located on the n-type cladding layer,
   wherein Si concentration distribution in a direction of stacking the n-type cladding layer and the active layer has a local peak in the active layer.

Points of the Invention

According to the present invention, it is possible to provide a a nitride semiconductor light-emitting element with improved light output.

BRIEF DESCRIPTION OF THE DRAWINGS

Next, the present invention will be explained in more detail in conjunction with appended drawings, wherein:

FIGS. 4A and 4B are diagrams illustrating the results of measuring light output of the nitride semiconductor light-emitting element shown in FIG. 1, wherein FIG. 4A is graphic representation of a relation between light output and Si concentration and FIG. 4B is a table showing the relation between light output and Si concentration;

DESCRIPTION OF THE PREFERRED EMBODIMENTS

Embodiments of the invention will be described in reference to the drawings. The embodiments below are described as preferred examples for implementing the invention. Although some part of the embodiments specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element.

In addition, throughout the following description, "upper/on" always means a side where a p-side electrode 92 is located (see FIG. 1) and "lower/under" always means a side where a substrate 10 is located (see FIG. 1), regardless of whether the nitride semiconductor light-emitting element is face-up mounted or flip-chip mounted. Unless specifically described otherwise, "upper/on" or "lower/under" indicates a relative position of one object to another object, and includes not only a state in which the one object is arranged on or under the other object without any third object in-between, but also a state in which the one object is arranged on or under the other object with a third object in-between.

First Embodiment

Figure 1:
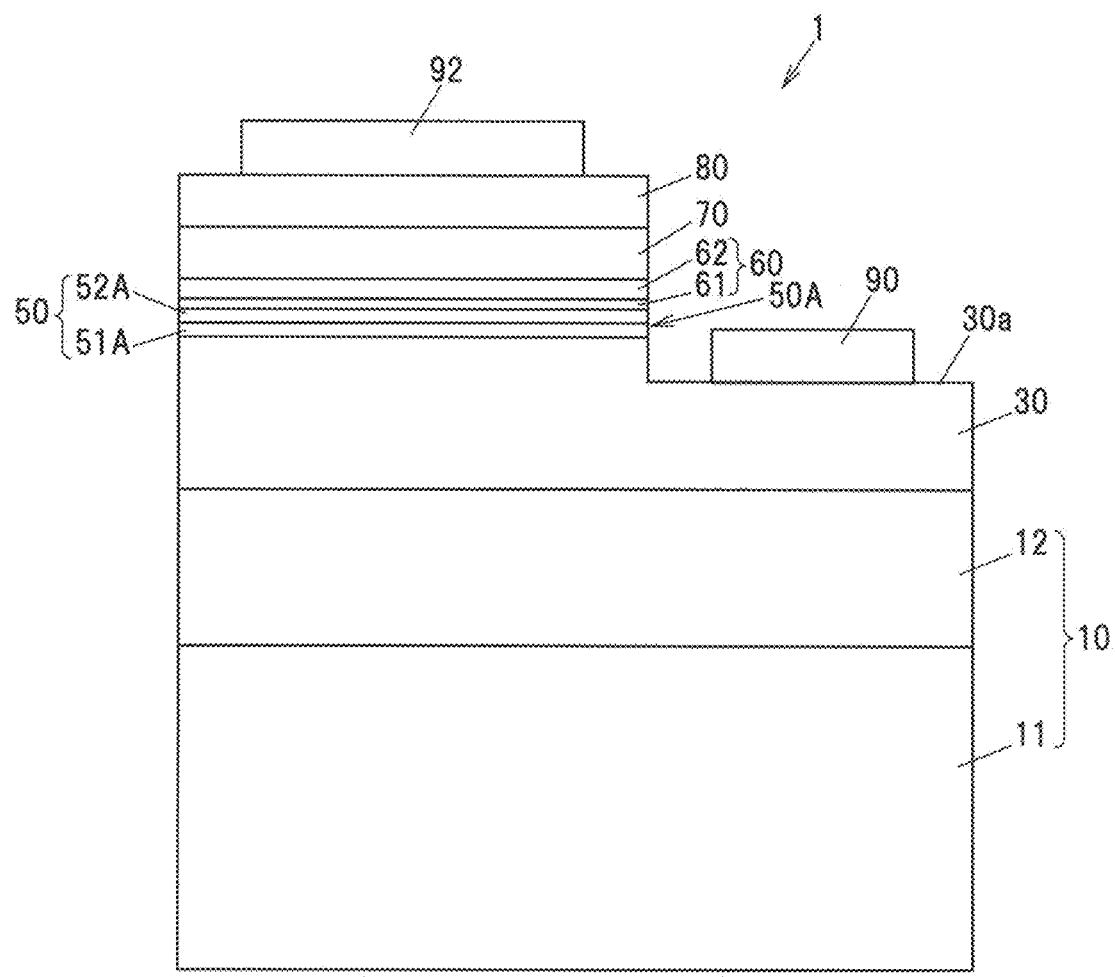
FIG. 1 is a schematic cross-sectional view showing an exemplary configuration of a nitride semiconductor light-emitting element in the first embodiment of the present invention.

Configuration of Nitride Semiconductor Light-Emitting Element in the First Embodiment FIG. 1 is a schematic cross-sectional view showing an exemplary configuration of a nitride semiconductor light-emitting element in the first embodiment of the invention. A nitride semiconductor light-emitting element (hereinafter, also simply referred to as "light-emitting element") 1 includes, e.g., laser diode or light-emitting diode (LED). In the first embodiment, a light-emitting diode (LED) which emits ultraviolet light at a central wavelength of 250 nm to 360 nm (preferably, 295 nm to 360 nm) will be described as an example of the light-emitting element 1.

As shown in FIG. 1, the light-emitting element 1 in the first embodiment includes a substrate 10, an n-type cladding layer 30, an active layer 50 including a single barrier layer 51A and a single well layer 52A, an electron blocking layer 60, a p-type cladding layer 70, a p-type contact layer 80, an n-side electrode 90 and a p-side electrode 92.

The semiconductor which can be used to form the light-emitting element 1 is, e.g., a binary or ternary group III nitride semiconductor which is expressed by $Al_xGa_{1-x}N$ ($0 \le x \le 1$). In addition, nitrogen (N) may be partially substituted with phosphorus (P), arsenic (As), antimony (Sb) or bismuth (Bi), etc.

The substrate 10 includes, e.g., a sapphire ($Al_2O_3$) substrate 11 and a buffer layer 12 formed on the sapphire substrate 11. The buffer layer 12 is formed of aluminum nitride (AlN). Instead of such a configuration, e.g., an AlN substrate formed of only AlN may be used as the substrate 10, and in this case, the buffer layer 12 may not be necessarily included. In other words, the substrate 10 is configured that a surface on the semiconductor layer side (hereinafter, also referred to as "the outermost surface") is formed of AlN.

The n-type cladding layer 30 is formed on the substrate 10. The n-type cladding layer 30 is, e.g., a layer formed of n-type AlGaN doped with silicon (Si) as an n-type impurity (hereinafter, also simply referred to as "n-type AlGaN"). Germanium (Ge), selenium (Se), tellurium (Te) or carbon (C), etc., may alternatively be used as the n-type impurity.

The Al composition (also called AlN mole fraction) in the n-type cladding layer 30 is not less than 20%, preferably, not less than 25% and not more than 55%. The n-type cladding layer 30 has a thickness of about 1 μm to 4 μm and is, e.g., about 3±0.3 μm in thickness. The n-type cladding layer 30 may have a single layer or a multilayer structure.

The active layer 50 is formed on the n-type cladding layer 30. The active layer 50 includes a single quantum well structure 50A composed of the single barrier layer 51A located on the n-type cladding layer 30 side and the single well layer 52A located on the electron blocking layer 60 (described later) side (i.e., on the opposite side to the n-type cladding layer 30 in the thickness direction). In addition, the active layer 50 is configured to have a band gap of not less than 3.4 eV so that ultraviolet light at a wavelength of not more than 360 nm is output. The single barrier layer 51A has a thickness in a range of, e.g., 5 nm to 50 nm. The single well layer 52A has a thickness in a range of, e.g., 1 nm to 5 nm, preferably, 3 nm to 5 nm.

Both the single barrier layer 51A and the single well layer 52A are formed of AlGaN. In detail, the single barrier layer 51A includes $Al_rGa_{1-r}N$ and the single well layer 52A includes $Al_sGa_{1-s}N$ ($0 \le r \le 1$, $0 \le s \le 1$, $r > s$). That is, the Al composition in AlGaN constituting the single barrier layer 51A is higher than the Al composition in AlGaN constituting the single well layer 52A. The positions of the single barrier layer 51A and the single well layer 52A in the single quantum well structure 50A are not limited to those described above. The single well layer 52A may be located on the n-type cladding layer 30 side and the single barrier layer 51A on the electron blocking layer 60 side.

Meanwhile, the concentration of Si in a direction of stacking the n-type cladding layer 30, the single barrier layer 51A and the single well layer 52A (hereinafter, also simply referred to as "Si concentration") has a distribution with a local peak in a portion from the single barrier layer 51A to the single well layer 52A, i.e., in the active layer 50. In other words, the Si concentration distribution in the thickness direction of the light-emitting element 1 has a local peak in the active layer 50.

Preferably, the Si concentration distribution has a local peak in the single barrier layer 51A or the single well layer 52A. The peak value of the Si concentration is not less than $1.0 \times 10^{18}$ atoms/cm$^3$ and not more than $1.0 \times 10^{20}$ atoms/cm$^3$. The details of the Si concentration will be described later.

The electron blocking layer 60 is formed on the active layer 50. In the first embodiment, the electron blocking layer 60 includes, in the following order, a first electron blocking layer 61 formed of AlN and a second electron blocking layer 62 formed of AlGaN with p-type conductivity (hereinafter, also simply referred to as "p-type AlGaN"). The electron blocking layer 60 has a thickness of, e.g., about 1 nm to 30 nm. In this regard, the first electron blocking layer 61 is not an essential constituent. In addition, the second electron blocking layer 62 is not necessarily limited to a p-type semiconductor layer and may be an undoped semiconductor layer.

The p-type cladding layer 70 is formed on the electron blocking layer 60. The p-type cladding layer 70 is a layer formed of, e.g., p-type $Al_tGa_{1-t}N$ ($0 \le t \le 1$) doped with magnesium (Mg) as a p-type impurity. Alternatively, zinc (Zn), beryllium (Be), calcium (Ca), strontium (Sr) or barium (Ba), etc., may be used as the p-type impurity. The p-type cladding layer 70 has a thickness of, e.g., about 10 nm to 1000 nm.

The p-type contact layer 80 is formed on the p-type cladding layer 70. The p-type contact layer 80 is, e.g., a p-type GaN layer doped with a high concentration of impurity such as Mg.

Electrodes

The n-side electrode 90 is formed on a certain region of the n-type cladding layer 30. The n-side electrode 90 is formed of, e.g., a multilayered film formed by sequentially stacking titanium (Ti), aluminum (Al), Ti and gold (Au) on the n-type cladding layer 30.

The p-side electrode 92 is formed on the p-type contact layer 80. The p-side electrode 92 is formed of, e.g., a multilayered film formed by sequentially stacking nickel (Ni) and gold (Au) on the p-type contact layer 80.

Method for Manufacturing Light-Emitting Element 1 in the First Embodiment

Next, a method for manufacturing the light-emitting element 1 will be described. Firstly, the substrate 10 with the outermost surface formed of AlN is formed by growing the buffer layer 12 on the sapphire substrate 11 at high temperature. Next, the n-type cladding layer 30, the active layer 50, the electron blocking layer 60 and the p-type cladding layer 70 are stacked on the substrate 10, thereby forming a disc-shaped nitride semiconductor stacked body (also called "wafer") with a predetermined diameter (e.g., 50 mm).

The n-type cladding layer 30, the active layer 50, the electron blocking layer 60 and the p-type cladding layer 70 can be formed by a well-known epitaxial growth method such as Metal Organic Chemical Vapor Deposition (MOCVD) method, Molecular Beam Epitaxy (MBE) method, or Halide Vapor Phase Epitaxy (HVPE) method. In addition, the single well layer 52A is doped with Si at a predetermined doping amount. The doping amount is preferably $1.0 \times 10^{18}$ to $1.0 \times 10^{20}$ atoms/cm$^3$.

Next, a mask is formed on the p-type cladding layer 70. Then, the active layer 50, the electron blocking layer 60 and the p-type cladding layer 70 are removed in the exposed region in which the mask is not formed. The active layer 50, the electron blocking layer 60 and the p-type cladding layer 70 can be removed by, e.g., plasma etching.

The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 can be formed by, e.g., a well-known method such as electron beam evaporation method or sputtering method. The light-emitting element 1 shown in FIG. 1 is obtained by cutting this wafer into pieces with a predetermined dimension.

Example in the First Embodiment

Figure 2:
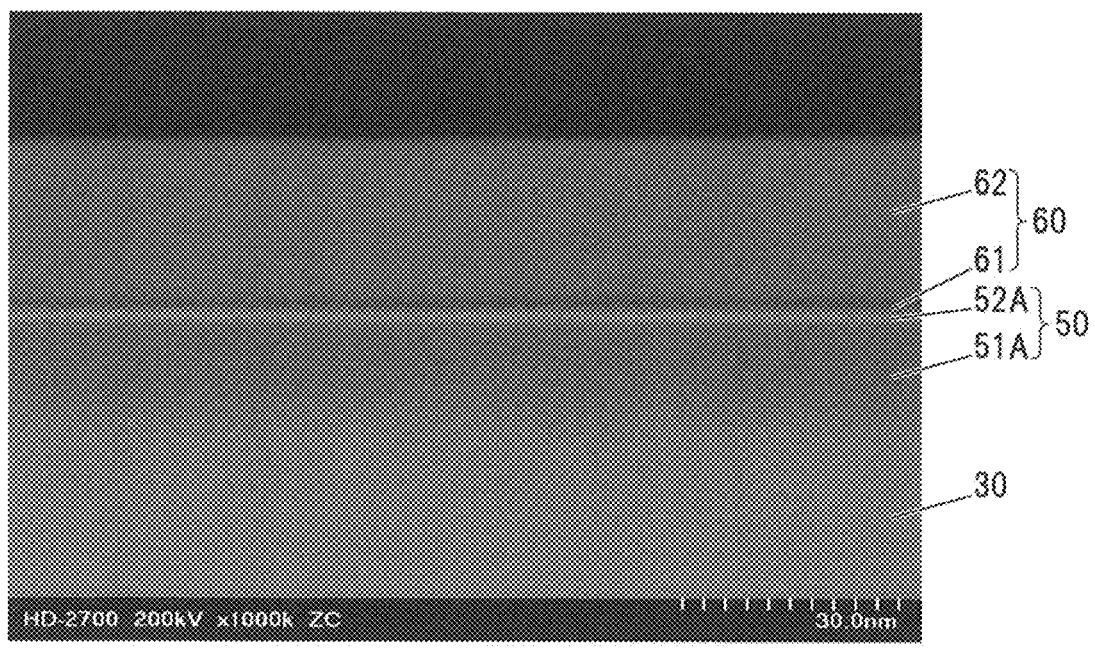
FIG. 2 is a STEM image showing a portion of a cross section of the nitride semiconductor light-emitting element shown in FIG. 1.

Next, Example in the first embodiment will be described. FIG. 2 is a STEM (Scanning Transmission Electron Microscopy) image showing a portion of a cross section of the light-emitting element 1 in Example of the first embodiment. The magnification of the image was 1,500,000 times and accelerating voltage was 200 kV. As shown in FIG. 2, the n-type cladding layer 30 (a portion with a relatively light color), the single barrier layer 51A (a portion with a darker color than the n-type cladding layer 30), the single well layer 52A (a portion with a lighter color than the single barrier layer 51A), the first electron blocking layer 61 (a portion with a darker color than the single well layer 52A) and the second electron blocking layer 62 (a portion with a lighter color than the first electron blocking layer 61) are formed sequentially from the bottom in the light-emitting element 1. The single barrier layer 51A and the single well layer 52A form the active layer 50 (specifically, the single quantum well structure 50A).

The thicknesses of the respective layers constituting the active layer 50 and the electron blocking layer 60 are summarized in Table 1 below.

TABLE 1

Thicknesses of the respective layers constituting the active layer 50 and the electron blocking layer 60

|  | Layer | Thickness |
|---|---|---|
| Electron blocking layer 60 | Second electron blocking layer 62 | 25.0 ± 2.5 nm |
|  | First electron blocking layer 61 | 1.7 ± 0.2 nm |
| Active layer 50 (Single quantum well structure 50A). | Single well layer 52A | 2.3 ± 0.2 nm |
|  | Single barrier layer 51A | 13.6 ± 1.4 nm |

Figure 3:
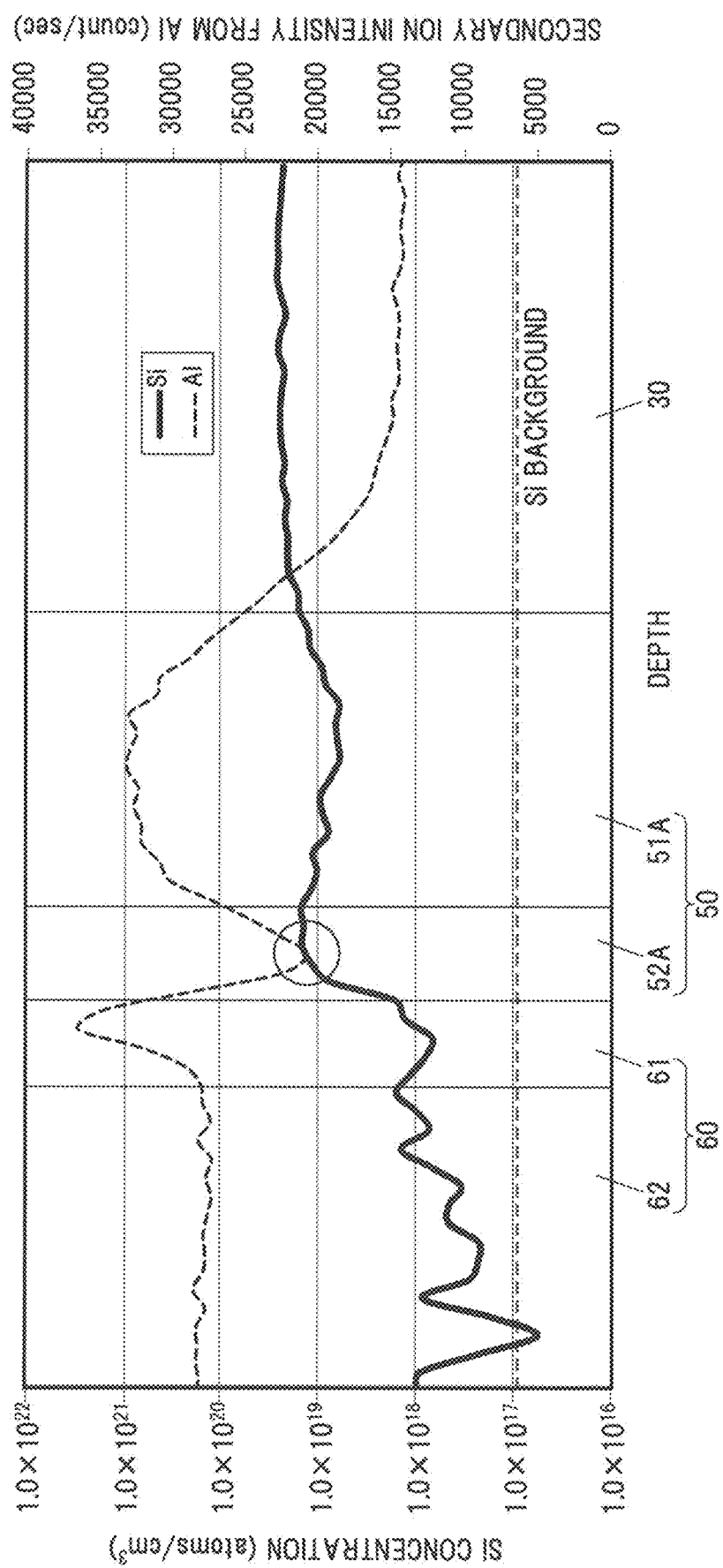
FIG. 3 is a diagram illustrating a Si concentration profile and an ion intensity profile of Al in the thickness direction of the nitride semiconductor light-emitting element shown in FIG. 1.

FIG. 3 is a diagram illustrating a Si concentration profile and an ion intensity profile of Al in the thickness direction of the light-emitting element 1 in Example of the first embodiment. The profiles shown in FIG. 3 were measured using SIMS (Secondary Ion Mass Spectrometry). The solid line (thick line) indicates the Si concentration (atoms/cm$^3$; see the scale marks on the left vertical axis), and the dashed line indicates the secondary ion intensity from Al (counts/second; see the scale marks on the right vertical axis).

In this Example, the n-type cladding layer 30, the single barrier layer 51A and the single well layer 52A were doped with Si (see the thin dashed line and "Si background" in FIG. 3). The doping amount was $(1.0 \pm 0.1) \times 10^{17}$ atoms/cm$^3$. Note that, the line which indicates Si doping (the thin dashed line) is drawn across the graph, from one end to the other end of the horizontal axis, for explanatory convenience.

As shown in FIG. 3, the Si concentration satisfies the following relational expressions (1) and (2):

Si concentration in Single well layer 52A≥Si concentration in n-type cladding layer 30     (1)

Si concentration in n-type cladding layer 30≥Si concentration in Single barrier layer 51A     (2)

This is because Si is less likely to be doped when the Al composition is higher.

In addition, the Si concentration distribution in the direction of stacking the n-type cladding layer 30, the single barrier layer 51A and the single well layer 52A has at least one or more peaks in a portion from the single barrier layer 51A to the single well layer 52A. As shown in FIG. 3, there is a peak in the single well layer 52A (see a circle in FIG. 3) in this Example. The peak value of the Si concentration in this case is $(1.5 \pm 0.2) \times 10^{19}$ atoms/cm$^3$.

Light Output

Next, a relation between the Si concentration and light output of the light-emitting element 1 will be described in reference to FIG. 4. FIGS. 4A and 4B are diagrams illustrating the results of measuring light output of the light-emitting elements 1 in Example of the first embodiment, wherein FIG. 4A is graphic representation of a relation between light output and Si concentration and FIG. 4B is a table showing the relation between light output and Si concentration. In FIG. 4A, the horizontal axis indicates the Si concentration in the single well layer 52A (e.g., the peak value in the single well layer 52A) (atoms/cm$^3$) and the vertical axis indicates the light output of the light-emitting element 1 (arbitrary unit, in comparison with our existing product). The light power output (arbitrary unit) can be measured by various methods, and the method used in this Example was, as an example, a method in which In (indium) electrodes were respectively attached to the center portion and edge portion of one wafer, a predetermined current was supplied to the electrodes to make the wafer emit light from the center portion, and light emission was measured by a photodetector set at a predetermined position. The magnitude of the current supplied at the time of measurement was 20 mA.

Figures 4A, 4B:
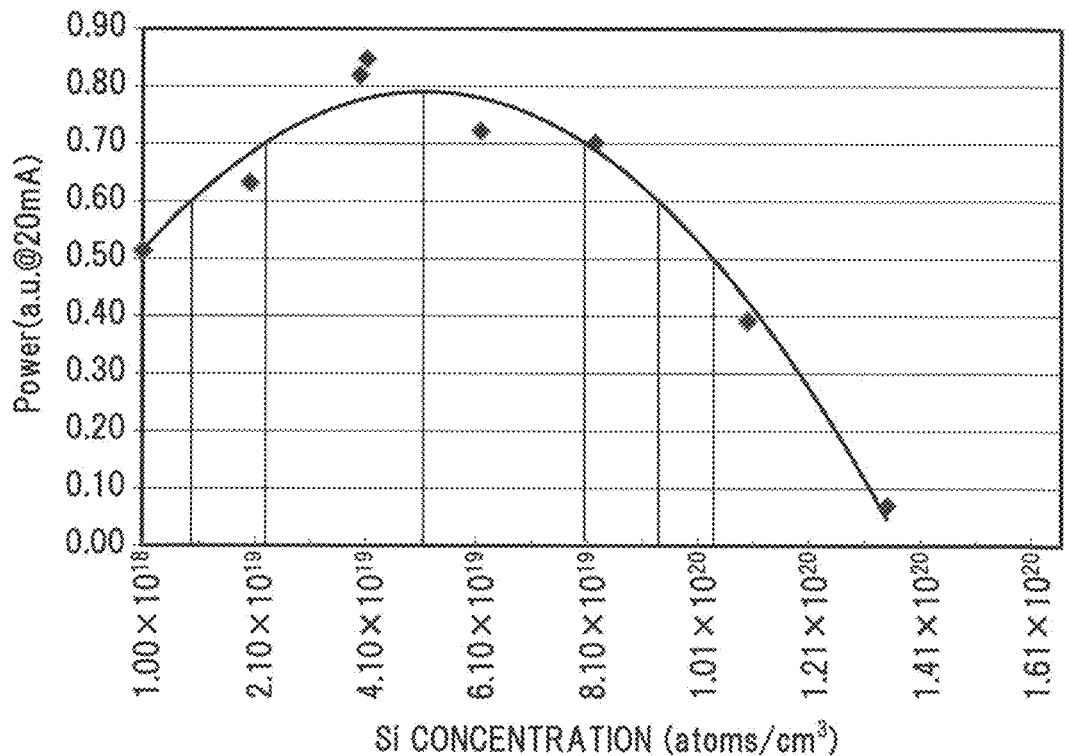

As shown in FIG. 4A, the light output of the light-emitting element 1 increases with the Si concentration in the single well layer 52A in a range of 0 to $(5.0 \pm 0.5) \times 10^{19}$ atoms/cm$^3$, reaches a maximum value at the Si concentration of around $(5.0 \pm 0.5) \times 10^{19}$ atoms/cm$^3$, and decreases when the Si concentration exceeds $(5.0 \pm 0.5) \times 10^{19}$ atoms/cm$^3$. That is, the light output of the light-emitting element 1 changes in an upwardly convex parabola shape, with the Si concentration in the single well layer 52A as a variable. In other words, the light output of the light-emitting element 1 is plotted on a quadratic curve, with the Si concentration in the single well layer 52A as a variable.

Based on this, it is possible to determine the range of the Si concentration in the single well layer 52A to obtain a predetermined light output of the light-emitting element 1. For example, the Si concertation may be adjusted to not less than $1.0 \times 10^{18}$ atoms/cm$^3$ and not more than $1.0 \times 10^{20}$ atoms/cm$^3$ so that the light output of the light-emitting element 1 is not less than 0.5, the Si concertation may be adjusted to not less than $8.5 \times 10^{18}$ atoms/cm$^3$ and not more than $9.5 \times 10^{19}$ atoms/cm$^3$ so that the light output of the light-emitting element 1 is not less than 0.6, and the Si concertation may be adjusted to not less than $2.2 \times 10^{19}$ atoms/cm$^3$ and not more than $8.2 \times 10^{19}$ atoms/cm$^3$ so that the light output of the light-emitting element 1 is not less than 0.7.

Second Embodiment

Figure 5:
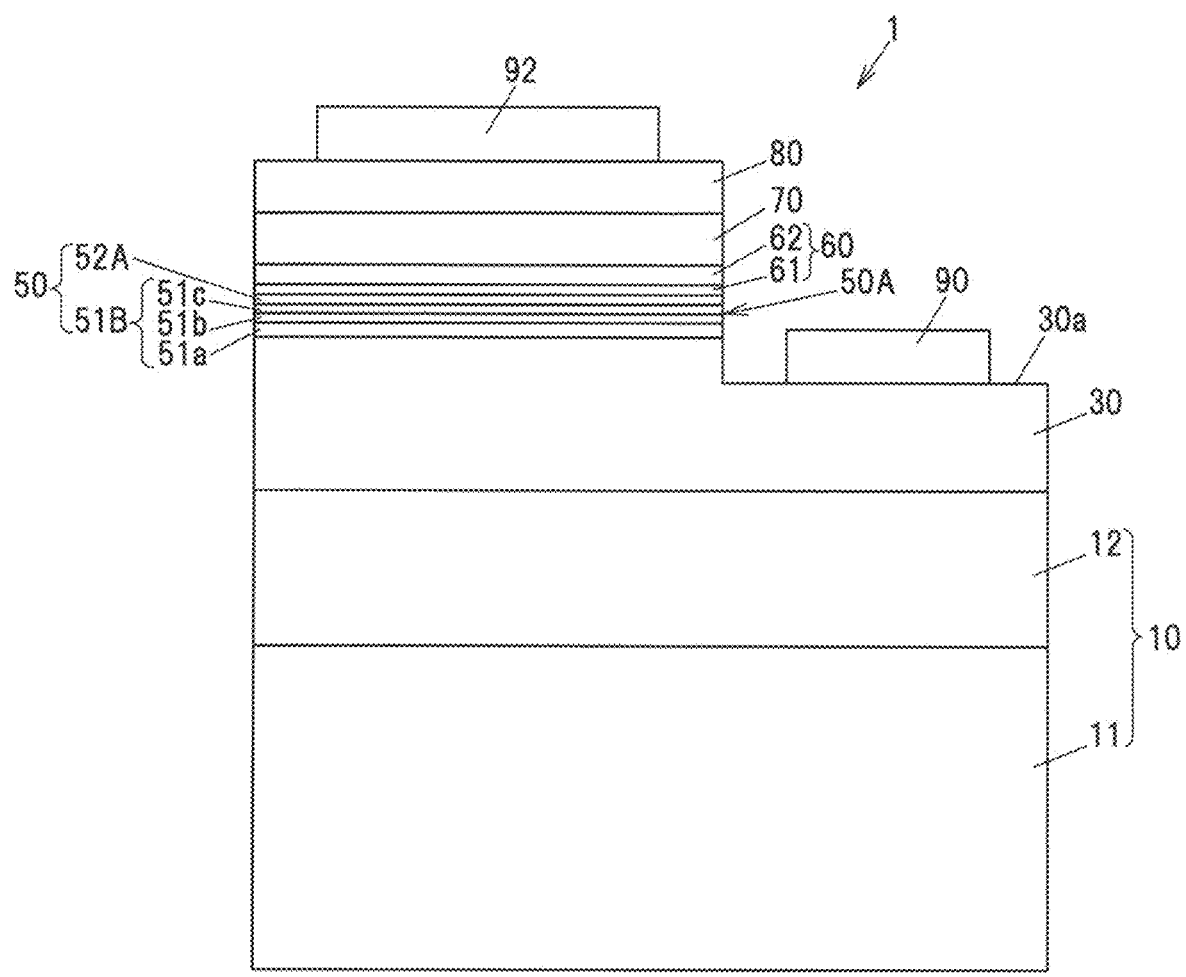
FIG. 5 is a schematic cross-sectional view showing an exemplary configuration of the nitride semiconductor light-emitting element in the second embodiment of the invention.

Next, the second embodiment of the invention will be described. FIG. 5 is a schematic cross-sectional view showing an exemplary configuration of the light-emitting element 1 in the second embodiment of the invention. The light-emitting element 1 in the second embodiment is different from the light-emitting element 1 in the first embodiment in having plural barrier layers 51B. In the following description, the detailed explanation for the configuration substantially the same as that in the first embodiment will be omitted by using the same reference numerals, and the difference from the first embodiment will be mainly described.

Configuration of Light-Emitting Element 1 in the Second Embodiment

As shown in FIG. 5, the light-emitting element 1 in the second embodiment includes the substrate 10, the n-type cladding layer 30, the active layer 50 including plural barrier layers 51B and the single well layer 52A, the electron blocking layer 60, the p-type cladding layer 70, the p-type contact layer 80, the n-side electrode 90 and the p-side electrode 92. The substrate 10, the n-type cladding layer 30, the single well layer 52A, the electron blocking layer 60, the p-type cladding layer 70, the p-type contact layer 80, the n-side electrode 90 and the p-side electrode 92 are the same as those in the first embodiment and the detailed description therefor will be omitted. The single well layer 52A is an example of the well layer.

The plural barrier layers 51B include a first barrier layer 51a located on the n-type cladding layer 30 side, a second barrier layer 51b provided on the first barrier layer 51a, and a third barrier layer 51c provided on the second barrier layer 51b and located on the single well layer 52A side. In other words, the active layer 50 has the plural barrier layers 51B consisting of the first barrier layer 51a, the second barrier layer 51b and the third barrier layer 51c stacked in this order from the n-type cladding layer 30 side toward the electron blocking layer 60, and also has the single well layer 52A stacked on the plural barrier layers 51B.

The first barrier layer 51a is formed of AlGaN. In addition, the first barrier layer 51a is a composition gradient layer in which the Al composition in AlGaN changes along the thickness direction. In detail, the Al composition in the AlGaN constituting the first barrier layer 51a increases from the n-type cladding layer 30 toward the second barrier layer 51b. The first barrier layer 51a is considered to have a function of preventing a non-continuous change in the Al composition between the n-type cladding layer 30 and the second barrier layer 51b so that the Al composition in the n-type cladding layer 30 is smoothly connected to that in the second barrier layer 51b. The first barrier layer 51a has a thickness of, e.g., 5 nm to 20 nm.

The second barrier layer 51b is formed of AlN. The second barrier layer 51b acts as a layer for inhibiting injection of electrons with not more than a predetermined energy into the active layer 50. The second barrier layer 51b has a thickness of, e.g., 1.0 nm to 5.0 nm.

The third barrier layer 51c has a thickness of 5 nm to 20 nm. The number of layers constituting the plural barrier layers 51B is not limited to three, and may be two, or not less than four.

The Si concentration distribution has a local peak in the plural barrier layers 51B. Preferably, the Si concentration distribution has a local peak in the vicinity of the boundary between the second barrier layer 51b and the third barrier layer 51c. The peak value of the Si concentration is not less than $1.0 \times 10^{18}$ atoms/cm$^3$ and not more than $1.0 \times 10^{20}$ atoms/cm$^3$.

Method for Manufacturing Light-Emitting Element 1 in the Second Embodiment

Next, a method for manufacturing the light-emitting element 1 in the second embodiment will be described. The main difference from the method for manufacturing the light-emitting element 1 in the first embodiment is as follows: an AlN layer as the second barrier layer 51b and the third barrier layer 51c doped with Si at a predetermined doping amount are formed in the second embodiment. The predetermined doping amount is preferably in a range of $1.0 \times 10^{18}$ to $1.0 \times 10^{20}$ atoms/cm$^3$.

Example in the Second Embodiment

Figure 6:
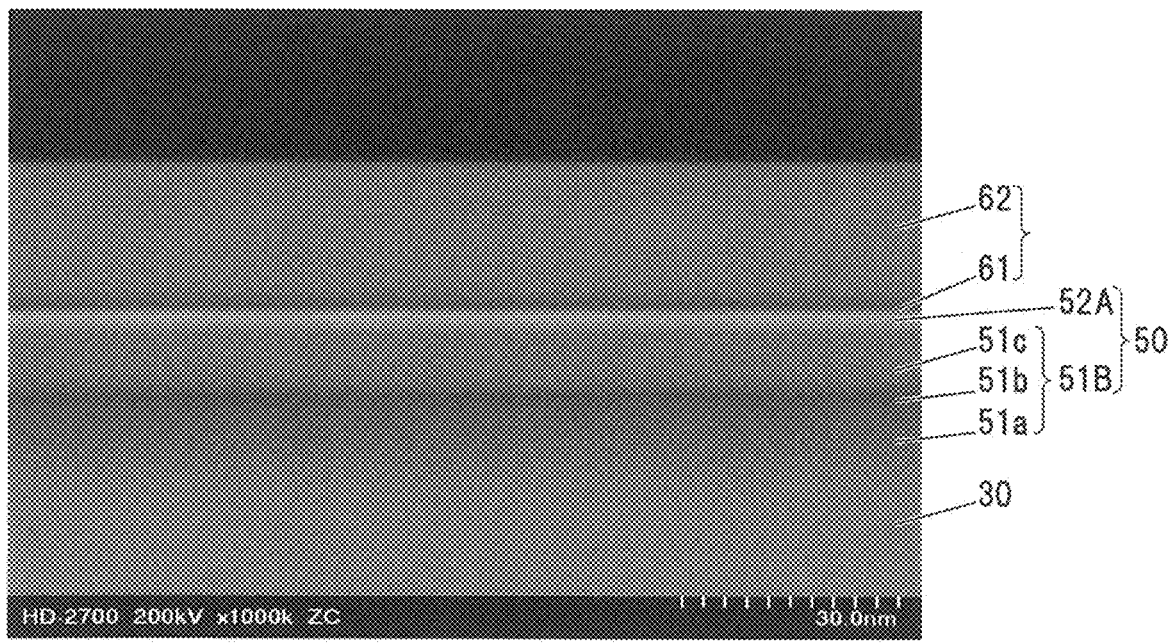
FIG. 6 is a STEM image showing a portion of a cross section of the nitride semiconductor light-emitting element shown in FIG. 5.

Next, Example in the second embodiment will be described. FIG. 6 is a STEM image showing a portion of a cross section of the light-emitting element 1 in Example of the second embodiment. The imaging conditions are the same as when taking the image shown in FIG. 2.

In the light-emitting element 1 in the second embodiment, a composition gradient layer as the first barrier layer 51a, an AlN layer as the second barrier layer 51b and the third barrier layer 51c are stacked in this order between the n-type cladding layer 30 and the single well layer 52A, as shown in FIG. 6.

The thicknesses of the respective layers constituting the active layer 50 and the electron blocking layer 60 are summarized in Table 2 below.

TABLE 2

Thicknesses of the respective layers constituting the active layer 50 and the electron blocking layer 60

| | Layer | | Thickness |
|---|---|---|---|
| Electron blocking layer 60 | Second electron blocking layer 62 | | 21.7 ± 2.2 nm |
| | First electron blocking layer 61 | | 1.7 ± 0.2 nm |
| Active layer 50 | Single well layer 52A | | 3.3 ± 0.3 nm |
| | Plural barrier layers 51B | Third barrier layer 51c | 11.0 ± 1.1 nm |
| | | Second barrier layer 51b | 1.5 ± 0.2 nm |
| | | First barrier layer 51a | 11.0 ± 1.1 nm |

As shown in Table 2, the single well layer 52A has a thickness of not less than 3.0 nm.

Figure 7:
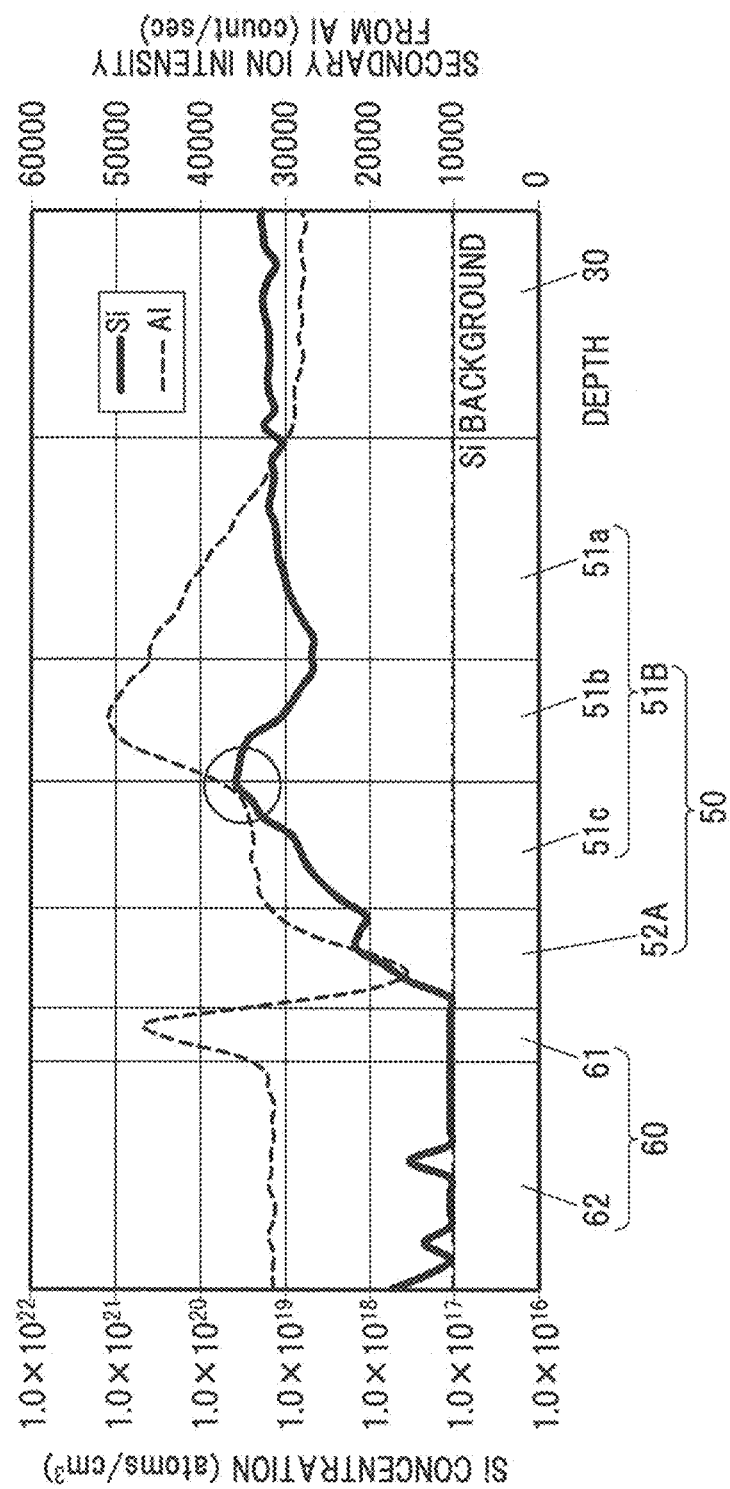
FIG. 7 is a diagram illustrating a Si concentration profile and an ion intensity profile of Al in the thickness direction of the nitride semiconductor light-emitting element shown in FIG. 5.

FIG. 7 is a diagram illustrating a Si concentration profile and an ion intensity profile of Al in the thickness direction of the light-emitting element 1 in Example of the second embodiment. As shown in FIG. 7, the Si concentration distribution has a peak in the plural barrier layers 51B, in particular, in the vicinity of the boundary between the second barrier layer 51b and the third barrier layer 51c. The peak value of the Si concentration here is $(4.0\pm0.4)\times10^{19}$ atoms/cm$^3$.

Meanwhile, in the light-emitting element 1 in Example of the second embodiment, the thickness of the single well layer 52A is 3.3±0.3 nm, as shown in Table 2. While the thickness of the well layer in the conventional technique is limited to approximately not more than 2.0 nm to reduce an impact of polarization due to generation of a piezoelectric field, the thickness of the single well layer 52A in the light-emitting element 1 of the second embodiment can be increased to more than the thickness in the conventional technique (e.g., increased to not less than about 1.5 times the thickness of 2.0 nm which is relatively large in the conventional technique).

Third Embodiment

Figure 8:
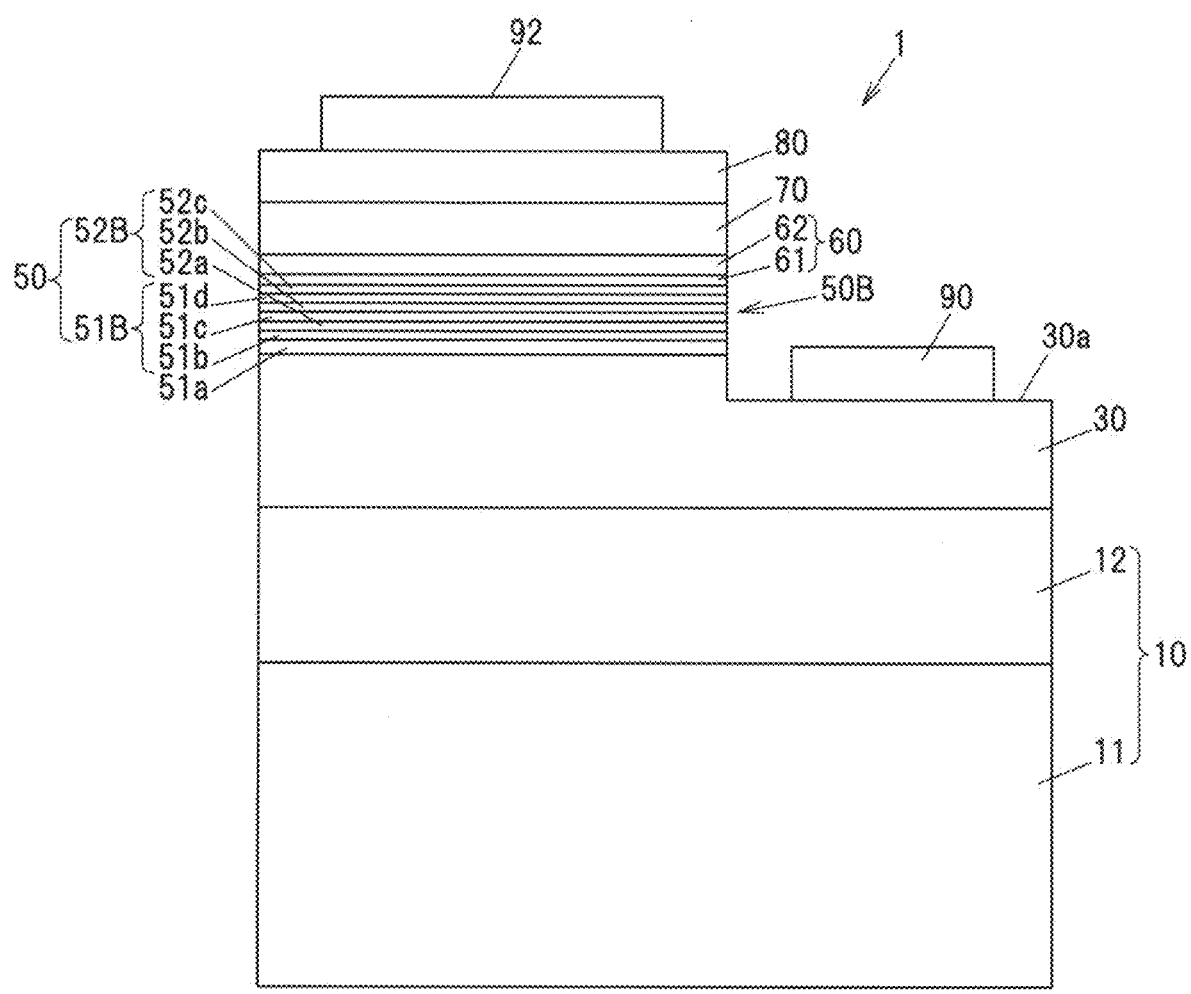
FIG. 8 is a schematic cross-sectional view showing an exemplary configuration of the nitride semiconductor light-emitting element in the third embodiment of the invention.

Next, the third embodiment of the invention will be described. FIG. 8 is a schematic cross-sectional view showing an exemplary configuration of the light-emitting element 1 in the third embodiment of the invention. The light-emitting element 1 in the third embodiment is different from the light-emitting element 1 in the first embodiment and the light-emitting element 1 in the second embodiment in having a multiple quantum well structure 50B which is formed by alternately stacking plural barrier layers 51B and plural well layers 52B. In the following description, the detailed explanation for the configuration substantially the same as that in the first and second embodiments will be omitted by using the same reference numerals, and the difference from the first and second embodiments will be mainly described. The light-emitting element 1 in the third embodiment emits ultraviolet light at a central wavelength of 250 nm to 360 nm (preferably, 250 nm to 295 nm).

Configuration of Light-Emitting Element 1 in the Third Embodiment

As shown in FIG. 8, the light-emitting element 1 in the third embodiment includes the substrate 10, the n-type cladding layer 30, the active layer 50 having the first barrier layer 51a as a composition gradient layer and a multiple quantum well structure 50B including plural barrier layers 51B and plural well layers 52B, the electron blocking layer 60, the p-type cladding layer 70, the p-type contact layer 80, the n-side electrode 90 and the p-side electrode 92. In the following description, the composition gradient layer is also called the first barrier layer 51a for explanatory convenience, but is regarded as being different and distinguished from the plural barrier layers 51B constituting the multiple quantum well structure 50B.

In the active layer 50 of the third embodiment, the multiple quantum well structure 50B formed by alternately stacking the plural barrier layers 51B formed to include $Al_rGa_{1-r}N$ and the plural well layers 52B formed to include $Al_sGa_{1-s}N$ is provided on the first barrier layer 51a. In detail, the active layer 50 has the multiple quantum well structure 50B formed by alternately stacking K layers of the barrier layers 51B including $Al_rGa_{1-r}N$ and K layers of the well layers 52B including $Al_sGa_{1-s}N$. K is a natural number.

In more detail, the active layer 50 has the multiple quantum well structure 50B in which the second barrier layer 51b including $Al_{r1}Ga_{1-r1}N$, a first well layer 52a including $Al_{s1}Ga_{1-s1}N$, the third barrier layer 51c including $Al_{r2}Ga_{1-r2}N$, a second well layer 52b including $Al_{s2}Ga_{1-s2}N$, a fourth barrier layer 51d including $Al_{r3}Ga_{1-r3}N$, and a third well layer 52c including $Al_{s3}Ga_{1-s3}N$ ($0 \leq r1, r2, r3 \leq 1$, $0 \leq s1, s2, s3 \leq 1$, $r1, r2, r3 > s1, s2, s3$) are stacked in this order. Although the example of K=3 is shown in FIG. 8, K is not limited to 3 and may be 2, or not less than 4. The first well layer 52a in the third embodiment is an example of the lower well layer. The second well layer 52b and the third well layer 52c in the third embodiment are examples of the upper well layer.

In the configuration including the multiple quantum well structure 50B, the Si concentration distribution preferably has a local peak in the well layer closest to the n-type cladding layer 30 (i.e., the first well layer 52a), among the plural well layers 52B.

Method for Manufacturing Light-Emitting Element 1 in the Third Embodiment

Next, a method for manufacturing the light-emitting element 1 in the third embodiment will be described. The main difference from the method for manufacturing the light-emitting element 1 in the first embodiment and the light-emitting element 1 in the second embodiment is as follows: the first well layer 52a is doped with Si at a predetermined doping amount in the third embodiment. The predetermined doping amount is preferably in a range of $1.0\times10^{18}$ to $1.0\times10^{20}$ atoms/cm$^3$.

Example in the Third Embodiment

Figure 9:
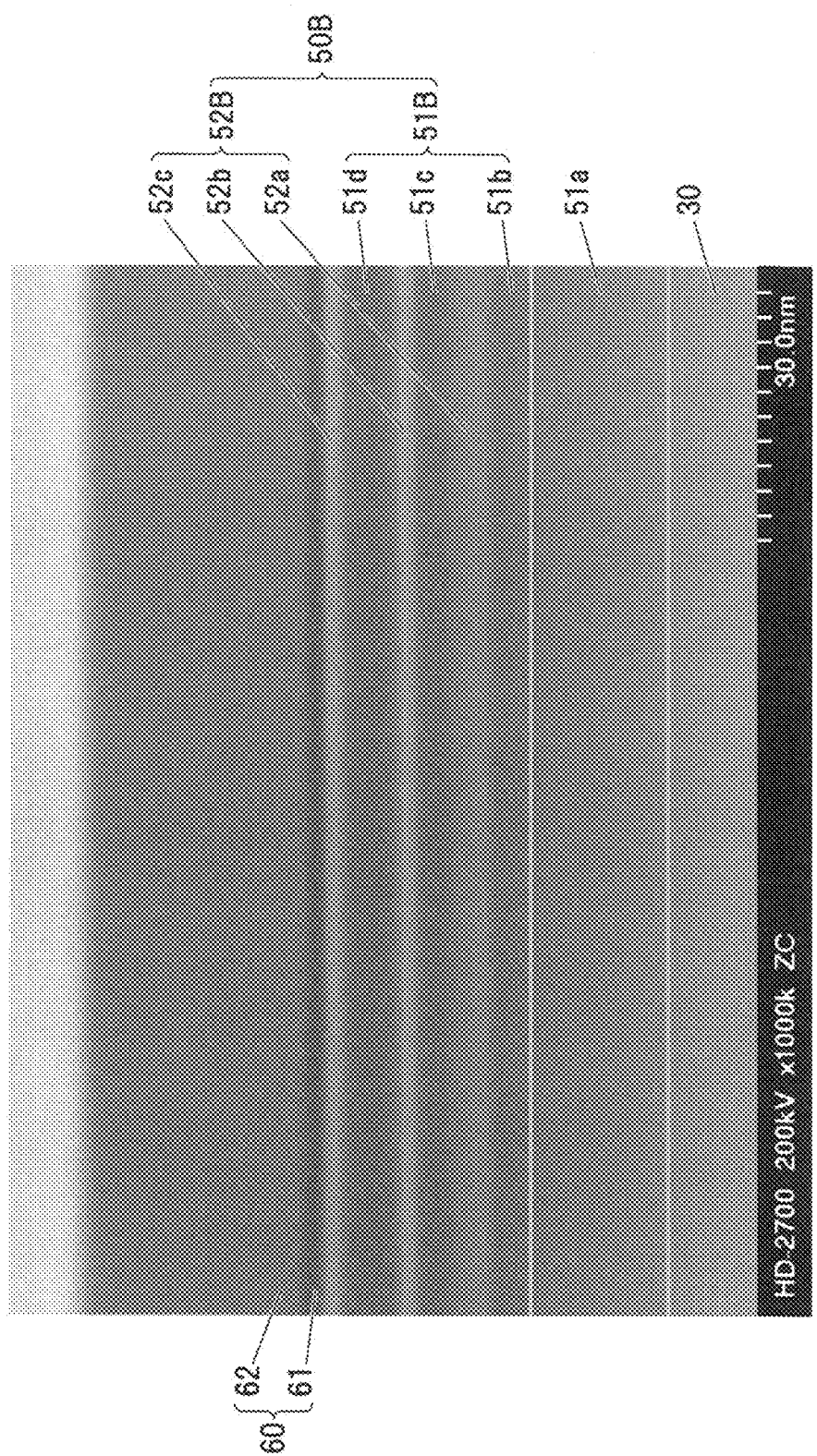
FIG. 9 is a STEM image showing a portion of a cross section of the nitride semiconductor light-emitting element shown in FIG. 8.

Next, Example in the third embodiment will be described. FIG. 9 is a STEM image showing a portion of a cross section of the light-emitting element 1 in Example of the third embodiment. The imaging conditions are the same as when taking the image shown in FIG. 2.

In the light-emitting element 1 in the third embodiment, a composition gradient layer as the first barrier layer 51a and the active layer 50 constructed from the multiple quantum well structure 50B formed by alternately stacking three barrier layers and three well layers are stacked in this order, as shown in FIG. 9. The dashed lines indicate, sequentially from the lower side, an interface between the n-type cladding layer 30 and the first barrier layer 51a (the composition gradient layer) and an interface between the first barrier layer 51a (the composition gradient layer) and the plural barrier layers 51B (in particular, the second barrier layer 51b).

The thicknesses of the respective layers constituting the active layer 50 and the electron blocking layer 60 is summarized in Table 3 below.

TABLE 3

Thicknesses of the respective layers constituting the active layer 50 and the electron blocking layer 60

| | Layer | | Thickness |
|---|---|---|---|
| Electron blocking layer 60 | Second electron blocking layer 62 | | 25.0 ± 2.5 nm |
| | First electron blocking layer 61 | | 2.2 ± 0.4 nm |
| Active layer 50 (Multiple quantum well structure 50B) | Plural well layers 52B | Third well layer 52c | 2.2 ± 0.4 nm |
| | Plural barrier layers 51B | Fourth barrier layer 51d | 6.5 ± 0.7 nm |
| | Plural well layers 52B | Second well layer 52b | 2.2 ± 0.4 nm |
| | Plural barrier layers 51B | Third barrier layer 51c | 4.5 ± 0.5 nm |
| | Plural well layers 52B | First well layer 52a | 4.5 ± 0.5 nm |
| | Plural barrier layers 51B | Second barrier layer 51b | 5.5 ± 0.7 nm |
| First barrier layer 51a | Composition gradient layer | | 16.0 ± 2.0 nm |

As shown in Table 3, the thickness of the first barrier layer 51a (the composition gradient layer) is three to five times the thickness of each of the barrier layers and the well layers which constitute the multiple quantum well structure 50B. Meanwhile, the thickness of the first well layer 52a (i.e., the lower well layer) is not less than 3.0 nm which is 1.5 to 2.5 times the thicknesses of the other well layers (the second well layer 52b and the third well layer 52c, i.e., the upper well layers).

Figure 10:
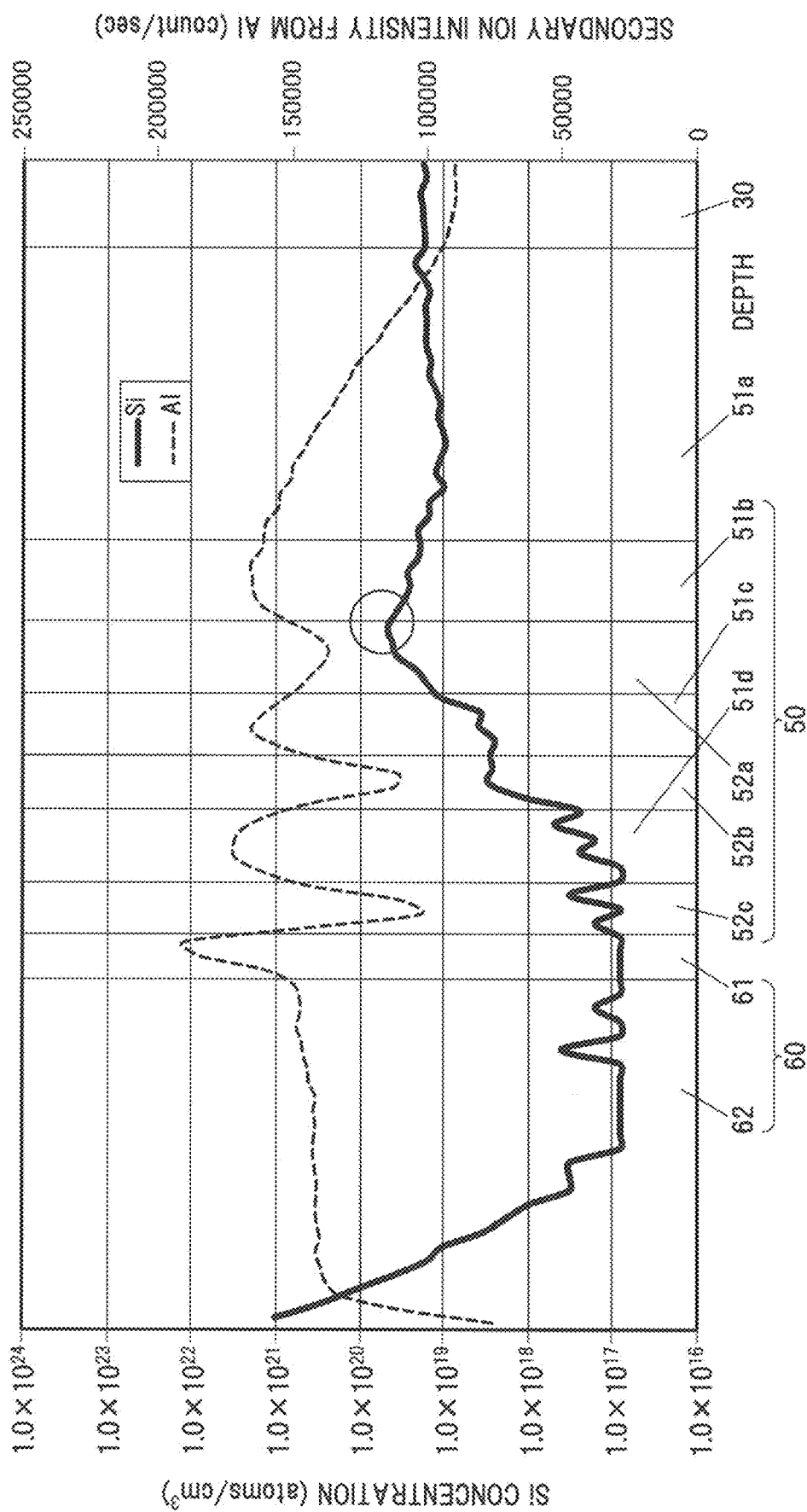
FIG. 10 is a diagram illustrating a Si concentration profile and an ion intensity profile of Al in the thickness direction of the nitride semiconductor light-emitting element shown in FIG. 8.

FIG. 10 is a diagram illustrating a Si concentration profile and an ion intensity profile of Al in the thickness direction of the light-emitting element 1 in Example of the third embodiment. As shown in FIG. 10, the Si concentration has a peak in the first well layer 52a. The peak value of the Si concentration here is $(4.5\pm0.5)\times10^{19}$ atoms/cm$^3$. As shown in FIG. 10, in the configuration including the multiple quantum well structure 50B, the Si concentration has a peak in the first well layer 52a which is located closest to the n-type cladding layer 30 among the plural well layers 52B.

Functions and Effect of the Embodiments

As described above, in the light-emitting elements 1 of the embodiments and modifications of the invention, the concentration of Si in the direction of stacking the n-type cladding layer 30 and the active layer 50 (hereinafter, also simply referred to as "Si concentration") has a distribution with a local peak in the active layer 50. Such a configuration improves the light output of the light-emitting element 1.

This effect is beneficial particularly for the light-emitting element 1 which emits deep ultraviolet light at a central wavelength of not less than 295 nm and not more than 360 nm and has the single quantum well structure 50A, and for the light-emitting element 1 which emits deep ultraviolet light at a central wavelength of not more than 295 nm and has the multiple quantum well structure 50B.

Summary of the Embodiments

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A nitride semiconductor light-emitting element (1), comprising: an n-type cladding layer (30) comprising n-type AlGaN; and an active layer (50) that comprises AlGaN and is located on the n-type cladding layer (30), wherein Si concentration distribution in a direction of stacking the n-type cladding layer (30) and the active layer (50) has a local peak in the active layer (50).

[2] The nitride semiconductor light-emitting element (1) described in [1], wherein the active layer (50) comprises a single quantum well structure (50A) that comprises a single barrier layer (51A) comprising AlGaN and located on the n-type cladding layer (30) side and a single well layer (52A) comprising AlGaN with a smaller Al composition than that of the AlGaN constituting the single barrier layer (51A), and the Si concentration distribution has the peak in the single well layer (52A).

[3] The nitride semiconductor light-emitting element (1) described in [1], wherein the active layer (50) comprises a plurality of barrier layers (51B) comprising a first barrier layer (51a) and a second barrier layer (51b), the first barrier layer (51a) comprising AlGaN with an Al composition gradient from the n-type cladding layer (30) side toward the active layer (50) side and the second barrier layer (51b) comprising AlN and being provided on the first barrier layer (51a), and the Si concentration distribution has the peak in the plurality of barrier layers (51B).

[4] The nitride semiconductor light-emitting element (1) described in [3], wherein the plurality of barrier layers (51B) further comprise a third barrier layer (51c) formed on the second barrier layer (51b), and the Si concentration distribution has the peak in the vicinity of the boundary between the second barrier layer (51b) and the third barrier layer (51c).

[5] The nitride semiconductor light-emitting element (1) described in [4], wherein the active layer (50) further comprises a single well layer (52A) formed on the third barrier layer (51c), and the single well layer (52A) has a thickness of not less than 3.0 nm.

[6] The nitride semiconductor light-emitting element (1) described in [1], wherein the active layer (50) comprises a multiple quantum well structure (50B) formed by alternately stacking a plurality of barrier layers (51B) and a plurality of well layers (52B), and the Si concentration distribution has the peak in a lower well layer that is one of the plurality of well layers (52B) and is located on the n-type cladding layer (30) side.

[7] The nitride semiconductor light-emitting element (1) described in [6], further comprising: a first barrier layer (51a) that comprises AlGaN with an Al composition gradient from the n-type cladding layer (30) side toward the active layer (50) side and is formed between the n-type cladding layer (30) and the active layer (50), wherein the thickness of the first barrier layer (51a) is three to five times the thickness of any of the plurality of barrier layers (51B) or any of the plurality of well layers (52B).

[8] The nitride semiconductor light-emitting element (1) described in [6] or [7], wherein the plurality of well layers (52B) comprise the lower well layer and an upper well layer located opposite to the n-type cladding layer (30) relative to the lower well layer, and the lower well layer has a thickness that is not less than 3.0 nm and is 1.5 to 2.5 times the thickness of the upper well layer.

[9] The nitride semiconductor light-emitting element (1) described in any one of [1] to [8], wherein the peak of the Si concentration has a value of not less than $1.0\times10^{18}$ atoms/cm$^3$ and not more than $1.0\times10^{20}$ atoms/cm$^3$.

[10] The nitride semiconductor light-emitting element (1) described in any one of [1] to [9], further comprising: a substrate (10) that is located under the n-type cladding layer (30) and comprises a surface comprising AlN.

[11] The nitride semiconductor light-emitting element (1) described in any one of [1] to [5], wherein the nitride semiconductor light-emitting element (1) emits deep ultraviolet light at a central wavelength of 295 nm to 360 nm.

[12] The nitride semiconductor light-emitting element (1) described in any one of [6] to [10], wherein the nitride semiconductor light-emitting element (1) emits deep ultraviolet light at a central wavelength of 250 nm to 295 nm.

What is claimed is:

1. A nitride semiconductor light-emitting element, comprising:
    an n-type cladding layer comprising n-type AlGaN; and
    an active layer located on the n-type cladding layer, the active layer comprising a plurality of barrier layers doped with Si, the plurality of barrier layers comprising an AlN layer and an AlGaN layer,
    wherein Si concentration distribution in a direction of stacking the n-type cladding layer and the active layer has a local peak between the AlN layer and the AlGaN layer.

2. The nitride semiconductor light-emitting element according to claim 1, wherein the plurality of barrier layers comprising a first barrier layer, a second barrier layer, and a third barrier layer formed on the second barrier layer, the first barrier layer comprising AlGaN with an Al composition gradient from the n-type cladding layer side toward the active layer side and the second barrier layer comprising AlN and being provided on the first barrier layer, and the Si concentration distribution has peaks in the plurality of barrier layers in the vicinity of the boundary between the second barrier layer and the third barrier layer.

3. The nitride semiconductor light-emitting element according to claim 2, wherein the active layer further comprises a single well layer formed on the third barrier layer, and the single well layer has a thickness of not less than 3.0 nm.

4. The nitride semiconductor light-emitting element according to claim 1, wherein the peak of the Si concentration has a value of not less than $1.0\times10^{18}$ atoms/cm$^3$ and not more than $1.0\times10^{20}$ atoms/cm$^3$.

5. The nitride semiconductor light-emitting element according to claim 1, further comprising:
    a substrate that is located under the n-type cladding layer and comprises a surface comprising AlN.

6. The nitride semiconductor light-emitting element according to claim 1, wherein the nitride semiconductor light-emitting element emits deep ultraviolet light at a central wavelength of 295 nm to 360 nm.

7. The nitride semiconductor light-emitting element, comprising:
    an n-type cladding layer comprising n-type AlGaN; and
    an active layer doped with Si located on the n-type cladding layer,
    the active layer comprising a single quantum well structure that comprises a single barrier layer comprising AlGaN and located on the n-type cladding layer side and a single well layer comprising AlGaN with a smaller Al composition than that of the AlGaN constituting the single barrier layer, and the Si concentration distribution has the peaks in the single well layer.

8. A nitride semiconductor light-emitting element, comprising:
    an n-type cladding layer comprising n-type AlGaN; and
    an active layer doped with Si located on the n-type cladding layer, the active layer comprising a multiple quantum well structure formed by alternately stacking a plurality of barrier layers and a plurality of well layers,
    wherein the Si concentration distribution has peaks at an end of a lower well layer that is one of the plurality of well layers and is located on the n-type cladding layer side of the multiple quantum well structure.

9. The nitride semiconductor light-emitting element according to claim 8, further comprising:
    a first barrier layer that comprises AlGaN with an Al composition gradient from the n-type cladding layer side toward the active layer side and is formed between the n-type cladding layer and the active layer,
    wherein the thickness of the first barrier layer is three to five times the thickness of any of the plurality of barrier layers or any of the plurality of well layers.

10. The nitride semiconductor light-emitting element according to claim 8, wherein the plurality of well layers comprise the lower well layer and an upper well layer located opposite to the n-type cladding layer relative to the lower well layer, and the lower well layer has a thickness that is not less than 3.0 nm and is 1.5 to 2.5 times the thickness of the upper well layer.

11. The nitride semiconductor light-emitting element according to claim 8, wherein the nitride semiconductor light-emitting element emits deep ultraviolet light at a central wavelength of 250 nm to 295 nm.

* * * * *